United States Patent
Mulay et al.

(10) Patent No.: US 10,353,004 B2
(45) Date of Patent: Jul. 16, 2019

(54) METHOD AND SYSTEM FOR DETECTING ROTOR FAULT USING TRIAXIAL MAGNETIC FIELD SENSOR

(71) Applicant: ABB Schweiz AG, Baden (CH)

(72) Inventors: Prasad Mulay, Nasik (IN); Maciej Orman, Shanghai (CN); Karthik Krishnamoorthi, Chennai (IN); Cajetan Pinto, Mumbai (IN); Pawel Rzeszucinski, Kedzierzyn-Kozle (PL)

(73) Assignee: ABB Schweiz AG, Baden (CH)

( * ) Notice: Subject to any disclaimer, the term of this patent is extended or adjusted under 35 U.S.C. 154(b) by 37 days.

(21) Appl. No.: 15/310,782

(22) PCT Filed: Mar. 24, 2015

(86) PCT No.: PCT/IB2015/052132
§ 371 (c)(1),
(2) Date: Nov. 13, 2016

(87) PCT Pub. No.: WO2015/173662
PCT Pub. Date: Nov. 19, 2015

(65) Prior Publication Data
US 2017/0082692 A1    Mar. 23, 2017

Related U.S. Application Data

(63) Continuation of application No. PCT/EP2014/059994, filed on May 15, 2014.

(51) Int. Cl.
*G01R 31/34* (2006.01)
*G01R 29/08* (2006.01)
(Continued)

(52) U.S. Cl.
CPC ....... *G01R 31/343* (2013.01); *G01R 29/0814* (2013.01); *G01R 33/04* (2013.01); *G01R 33/10* (2013.01)

(58) Field of Classification Search
None
See application file for complete search history.

(56) References Cited

U.S. PATENT DOCUMENTS 2,689,331 A    9/1954    Boyce et al.
3,506,914 A    4/1970    Albright et al.
(Continued)

FOREIGN PATENT DOCUMENTS

CN    101277052 A    9/2011
CN    102914741 A    2/2013
(Continued)

OTHER PUBLICATIONS

International Search Report, International Application No. PCT/IB2015/052132, dated May 27, 2015, 3 pages.
(Continued)

*Primary Examiner* — Douglas X Rodriguez
(74) *Attorney, Agent, or Firm* — Barnes & Thornburg LLP (57) ABSTRACT

In aspects, the present invention discloses a method of detecting a rotor fault in an electric machine using a data analysis unit. The method comprises measuring magnetic field strength along a first axis and a second axis, determining operating slip frequency of the electric machine using the measured magnetic field strength along the first axis and the second axis, determining an amplitude of the determined operating slip frequency in a first frequency spectrum and an amplitude of operating slip frequency in a second frequency spectrum, and detecting the rotor fault by comparing the amplitude of the determined operating slip frequency in the first frequency spectrum and the amplitude of operating slip frequency in the second frequency spectrum against a predetermined threshold.

6 Claims, 5 Drawing Sheets

(51) Int. Cl.
*G01R 33/04* (2006.01)
*G01R 33/10* (2006.01)

(56) References Cited

U.S. PATENT DOCUMENTS

| | | | |
|---|---|---|---|
| 5,049,815 A | 9/1991 | Kliman | |
| 5,519,337 A | 5/1996 | Casada | |
| 5,680,025 A * | 10/1997 | Bowers, III | G01R 31/343 318/430 |
| 5,739,698 A * | 4/1998 | Bowers | G01R 23/20 324/545 |
| 5,861,728 A | 1/1999 | Tazawa et al. | |
| 6,144,924 A * | 11/2000 | Dowling | G01R 31/343 702/60 |
| 6,466,009 B1 | 10/2002 | DeHaan et al. | |
| 7,081,760 B2 | 7/2006 | Mirafzal et al. | |
| 7,880,473 B2 | 2/2011 | Chari et al. | |
| 2005/0093536 A1 | 5/2005 | Lee et al. | |
| 2006/0006879 A1 * | 1/2006 | Mirafzal | G01R 31/343 324/545 |
| 2008/0265880 A1 | 10/2008 | Nishikawa | |
| 2009/0243647 A1 | 10/2009 | Chari et al. | |
| 2010/0169030 A1 * | 7/2010 | Parlos | G01H 1/00 702/58 |
| 2010/0311494 A1 | 12/2010 | Miller et al. | |
| 2011/0191034 A1 | 8/2011 | Lee et al. | |
| 2013/0234752 A1 | 9/2013 | Jaszcar et al. | |
| 2015/0260794 A1 * | 9/2015 | Athikessavan | G01R 31/343 702/58 |

FOREIGN PATENT DOCUMENTS

| | | |
|---|---|---|
| EP | 0181775 A1 | 5/1986 |
| GB | 692659 A | 6/1953 |
| GB | 2457590 A | 8/2009 |
| JP | S57196887 A | 12/1982 |
| JP | S63245292 A | 10/1988 |
| RO | 91569 A2 | 4/1987 |

OTHER PUBLICATIONS

Written Opinion issued in connection with International Application No. PCT/IB2015/052132, dated May 27, 2015, 5 pages.
International Preliminary Report on Patentability, International Application No. PCT/IB2015/052132, dated Nov. 15, 2016, 6 pages.
Chinese Office Action, Chinese Patent Application No. 201480071979, dated Feb. 12, 2018, 20 pages with English Translation.
Chinese Search Report, Chinese Patent Application No. 201480071979, dated Feb. 12, 2018, 2 pages with English Translation.
D. Belkhayate, R. Romary, M.EL. Adnani, R. Corton and J.F. Brundy, Fault Diagnosis in Induction Motors Using Magenetic Field Measurement with an Antenna, IOPscience, 2003 Meas. Sci. Technol. 14, pp. 1695 to 1700.
Andrian Ceban, Remus Pusca and Raphael Romary, Study of Rotor Faults in Induction Motors Using External Magnetic Field Analysis, IEEE Transactions on Industrial Electronics, vol. 59, No. 5, May 2012, p. 2082 to 2093.
European Patent Office, International Search Report & Written Opinion Issued in corresponding Application No. PCT/EP2014/059994, dated Oct. 1, 2014, 9 pages.

* cited by examiner

METHOD AND SYSTEM FOR DETECTING ROTOR FAULT USING TRIAXIAL MAGNETIC FIELD SENSOR

CROSS-REFERENCE TO RELATED APPLICATIONS

This application is a U.S. national stage of International Application Ser. No. PCT/IB2015/052132, filed Mar. 24, 2015, which claims priority to International Application Ser. No. PCT/EP2014/059994, filed May 15, 2014. The entire disclosures of both of the foregoing applications are hereby incorporated by reference.

TECHNICAL FIELD

The current invention relates to the field of condition monitoring of electric machine, and more particularly, the current invention relates to detection and determination of rotor fault using a magnetic field sensor.

BACKGROUND ART

Rotor winding asymmetry is one of the leading causes of induction motor failure. For the purpose of detection of rotor fault, many diagnostic methods have been developed so far. Among them, the most widely used in industry are vibration monitoring and current signature analysis.

The above mentioned methods rely on measurement of motor current and vibration for detecting fault in the rotor. However, effects seen in the motor current and the motor vibration are consequences of change in magnetic field due to broken or faulty rotor bar and therefore are less sensitive to rotor fault. This often leads to misinterpretation of results since the method relies on secondary symptoms for detection and not the root of the problem. In other words, in terms of the condition monitoring of electric machine, such as electric motor and electric generator, the electric machine's condition inferred from the measurement of the current or vibration of the electric machine is often unreliable.

Additionally, the above mentioned methods, for carrying out measurements, require sensors and other equipment which are often cumbersome to use, and are expensive. Moreover, these sensors have to be installed inside terminal box of the motor, which is often time consuming and requires the motor to be shut down. Further, improper installation of sensors can result in damage to the motor, faulty monitoring.

Therefore, in light of the above discussion, there is a need for a system and method that solves the problems mentioned above.

SUMMARY OF THE INVENTION

The above-mentioned shortcomings, disadvantages and problems are addressed herein which will be understood by reading and understanding the following specification.

In one aspect, the present invention provides a method of detecting a rotor fault in an electric machine using a data analysis unit. The method comprises the steps of measuring magnetic field strength along a first axis and a second axis, determining operating slip frequency of the electric machine using the measured magnetic field strength along the first axis and the second axis, determining an amplitude of the determined operating slip frequency in the first frequency spectrum and an amplitude of operating slip frequency in the second frequency spectrum, and detecting the rotor fault by comparing the amplitude of the determined operating slip frequency in the first frequency spectrum and the amplitude of operating slip frequency in the second frequency spectrum against a predetermined threshold.

The first axis is at a first angle to the axis of the rotor of the electric machine and the second axis is at a second angle to the axis of the rotor of the electric machine. The step of determining operating slip frequency comprises generating a first frequency spectrum from the measured magnetic field strength along the first axis and a second frequency spectrum from the magnetic field strength along the second axis, identifying a peak within a predetermined range in at least one of the first frequency spectrum and the second frequency spectrum, and determining a frequency corresponding to the identified peak within the predetermined range, in at least one of the first frequency spectrum and the second frequency spectrum.

In an embodiment, the method further comprises determining type of the detected rotor fault by comparing the amplitude of the determined operating slip frequency in the first frequency spectrum with the amplitude of operating slip frequency in the second frequency spectrum, and determining severity of the detected rotor fault by based on the amplitude of the determined operating slip frequency in the first frequency spectrum and the amplitude of operating slip frequency in the second frequency spectrum. In an embodiment, the method further comprises calculating the predetermined range based on a nominal slip frequency associated with the electric machine and a nominal line frequency associated with the electric machine.

In an embodiment, the method further comprises measuring magnetic field strength along a third axis at a third angle to the first axis, generating a third frequency spectrum from the measured magnetic field strength along the third axis, identifying a peak within a predetermined range in the third frequency spectrum, determining a frequency corresponding to the identified peak within the predetermined range, in the third frequency spectrum, and comparing the determined frequency against the determined operating slip frequency for detecting fault in a magnetic field sensor from the one or more magnetic field sensors.

In another aspect, the current invention discloses a system for detecting a rotor fault in an electric machine. The system includes a data analysis unit comprising one or more magnetic field sensors for measuring magnetic field strength along a first axis and a second axis, a network interface configured to communicate with a remote service device, one or more processors configured to generate a first frequency spectrum and a second frequency spectrum from the measured magnetic field strength along the first axis and the second axis, identify a peak within a predetermined range in at least one of the first frequency spectrum and the second frequency spectrum, determine operating slip frequency corresponding to the identified peak and detect the rotor fault based on an amplitude of the determined operating slip frequency in the first frequency spectrum and an amplitude of operating slip frequency in the second frequency spectrum, and a memory module operatively coupled to the one or more processors. The data analysis unit 120 is affixed on the frame of the electric machine, substantially close to the drive side bearing of the electric machine.

Systems and methods of varying scope are described herein. In addition to the aspects and advantages described in this summary, further aspects and advantages will become apparent by reference to the drawings and with reference to the detailed description that follows.

BRIEF DESCRIPTION OF THE DRAWINGS

The subject matter of the invention will be explained in more detail in the following text with reference to preferred exemplary embodiments which are illustrated in the drawings, in which.

DETAILED DESCRIPTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

Presence of broken rotor bar or end ring causes an unbalance to the rotor magnetic flux, as the current cannot flow through the broken or cracked bar/end-ring. The unbalanced rotor flux can be considered as the combination of positive- and negative sequence rotor flux, rotating at slip frequency in the opposite directions. This results in modulation of current which can be visible in spectrum as a twice slip sidebands around line frequency. However, in practice, the current sidebands around the fundamental may exist even when the electric machine is healthy. This could be due to uneven rotor bar resistance because of the die-casting process, rotor asymmetry, external load oscillations etc. Therefore, condition monitoring using current signature analysis is often unreliable.

The current invention discloses a method and system for detecting a rotor fault that does not rely on current signature analysis, rather utilizes the magnetic fields around the motor to detect rotor fault. The current invention discloses method involving installing a tri-axial low-cost magnetometer along with a low-power processor and a wireless radio on the surface of the motor in a pre-defined location such as on the body near the drive side bearing. The processor would periodically acquire magnetometer data using the tri-axial magnetometer from all three axes simultaneously, perform a Fourier transform on the three axes and check the unbalance in the amplitude of the slip frequency on the three axes. If the unbalance is above a pre-defined threshold, then a fault is detected. The fault is subsequently classified as broken rotor bar or misalignment by checking whether the dominant component is present in the axial or radial magnetic field. The severity of the fault is directly proportional to the amount of unbalance present in the magnetic field at the slip frequency. The severity of the fault indicator is stored in the memory of the processor and sent to a remote service device upon request. Thus continuous low-cost condition monitoring of the rotor is achieved.

Figure 1:
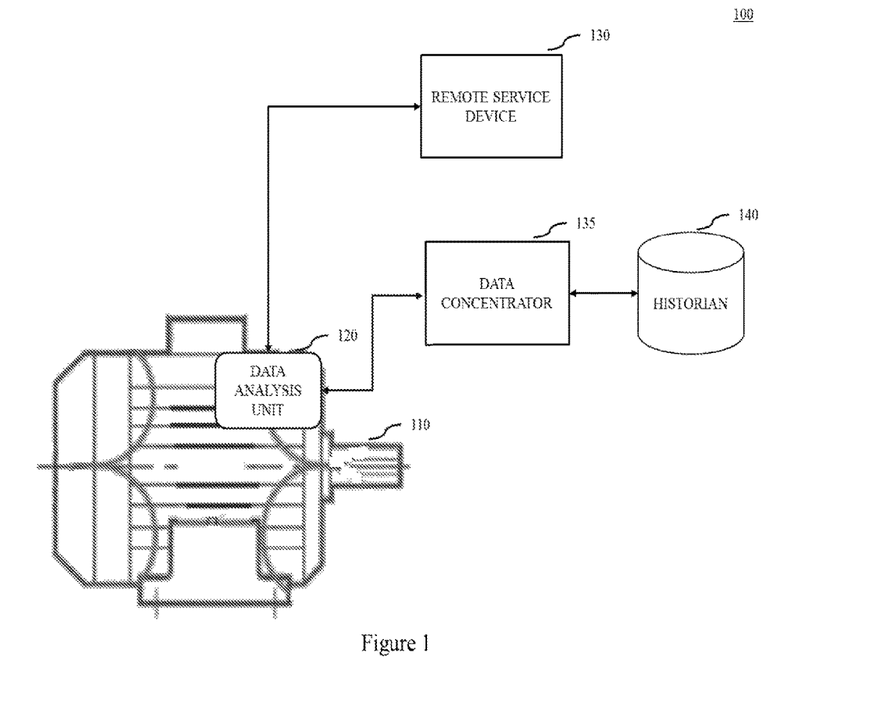
FIG. 1 illustrates a system for detecting rotor fault, in accordance with various embodiments of the present invention.

FIG. 1 illustrates a system 100 for condition monitoring, in accordance with various embodiments of the present invention. As shown in FIG. 1, the system 100 includes electrical machine 110 (shown in the FIG. 1 as a motor 110, and herein after referred to as motor 110). A data analysis unit 120 is installed on the frame of the motor 110 next to the drive side bearing. The data analysis unit 120 includes one or more processors, a memory module operatively coupled to the one or more processors, a network interface and a triaxial magnetic field sensor.

The triaxial magnetic field sensor measures magnetic field strength along a first axis, a second axis and a third axis in a reference point. In an embodiment, the first axis is substantially parallel to the axis of the rotor of the electric machine 110. The second and third axes are perpendicular to the first axis and to each other. Hereinafter, the magnetic field along first axis is also referred to as the axial magnetic field, and the magnetic field along the second axis is also referred to as the radial magnetic field. In an embodiment, the triaxial magnetic field sensor is a digital magnetic field sensor capable of taking equi-spaced samples at periodic intervals. In another embodiment, the triaxial magnetic field sensor is an analog magnet field sensor with an integrated analog to digital converter. The analog triaxial magnetic field sensor measures the magnetic field strength upon receiving a measurement request from the one or more processors.

The triaxial magnetic field sensor transmits measured magnetic field strength data to the one or more processors. The one or more processors perform analysis on the received data to detect whether a fault exists in the rotor and to determine the type and the severity of the fault. This is further explained in the description of FIG. 3. Subsequent to the analysis the one or more processors communicates, via the network interface, with a remote service device 130 and a data concentrator 135 to indicate the state of the rotor. The network interface is capable of communicating over wired medium such as Modbus, field bus, etc., and over wireless medium such as Bluetooth, Wireless HART, etc.

The data concentrator 135 acts like a gateway between data analysis unit 120 and a historian 140. The data concentrator transmits data regarding motor health, received from data analysis unit 120 to the historian 140 for remote storage.

It is to be noted by a person skilled in the art that while current invention discloses a tri-axial magnetic field sensor, a person skilled in the art can utilize two or more magnetic field sensors to achieve similar function.

Figure 2:
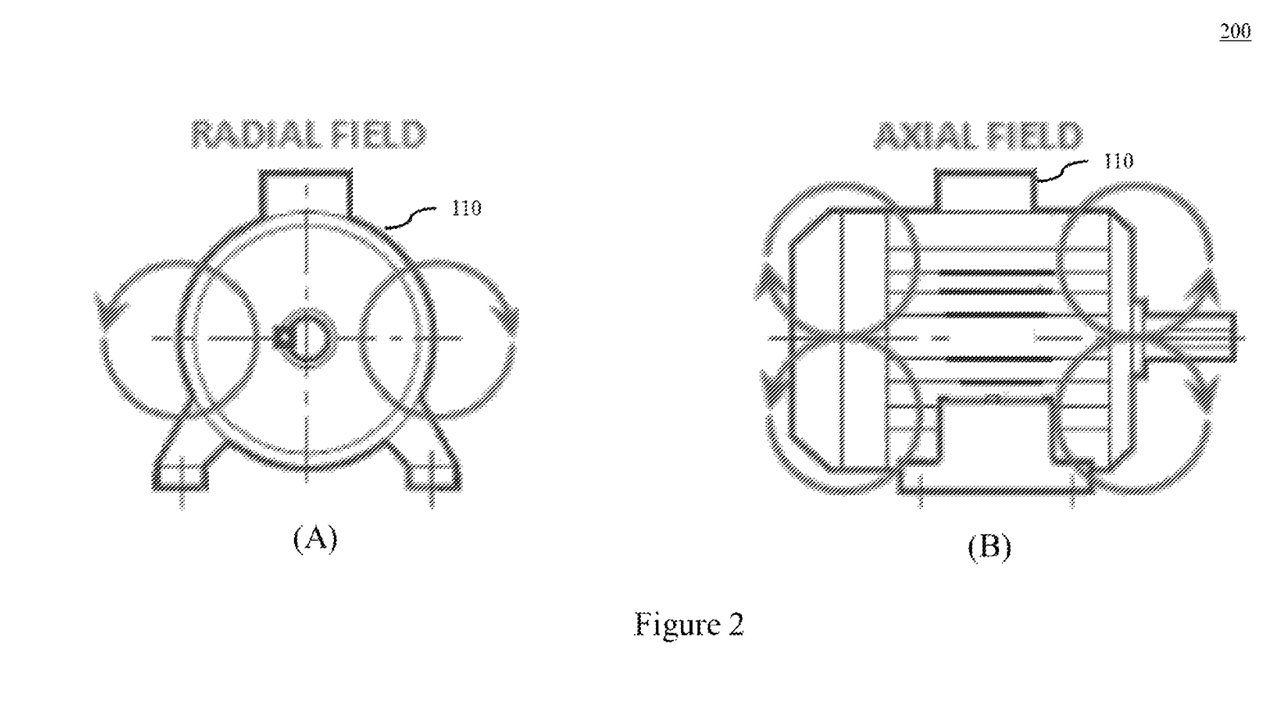
FIG. 2 illustrates a sectional view of axial magnetic field and a sectional view of radial magnetic field around an electric machine, in accordance with various embodiments of the present invention.

FIG. 2 shows a sectional view of axial magnetic field and a sectional view of radial magnetic field around the motor 110, in accordance with various embodiments of the present invention. As shown in FIG. 2, the magnetic fields around the motor 110 can be categorized as axial magnetic field and radial magnetic field. The axial magnetic field is in a plan which includes the axis of the motor 110; it is generated by currents in the stator end windings or rotor cage end ring. The radial field is located in a plane perpendicular to the axis of the motor 110, it is an image of the air-gap flux density which is attenuated by the stator magnetic circuit (package of laminations) and by the frame of the motor 110.

It has been determined through experimentation that damage to rotor bars of the electric machine results in increased axial magnetic flux and similarly misalignment of rotor results in increased radial magnetic flux.

Figure 3:
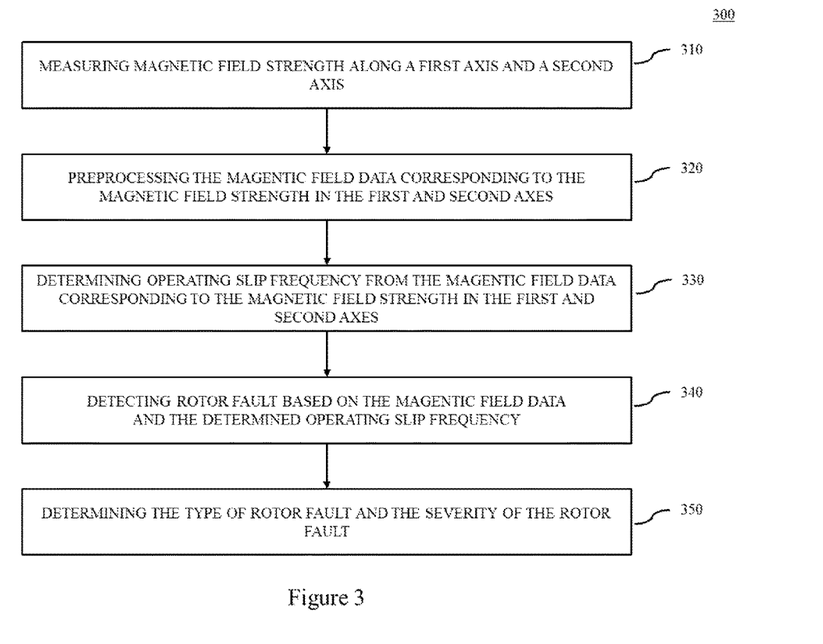
FIG. 3 illustrates a method for detecting rotor fault, in accordance with various embodiments of the present invention.

FIG. 3 illustrates a method 300 for condition monitoring, in accordance with various embodiments of the present invention. At step 310, the magnetic field strength along a first axis and a second axis is measured using the triaxial magnetic field sensor. The triaxial magnetic field sensor transmits the measured magnetic field strength data (hereinafter referred to as magnetic field data) of the first axis and the second axis to the one or more processors. In an embodiment, to distinguish the magnetic fields of the motor 110 from background magnetic field, measurement values above a predetermined threshold are recorded and transmitted by the triaxial magnetic field sensor to the one or more processors. In an embodiment, the predetermined base threshold is decided by experimentation. In another embodiment, the predetermined base threshold is determined during installation of the motor. In another embodiment, the triaxial magnetic field sensor records and transmits magnetic field data upon receiving a signal from an accelerometer or a motor drive indicating that the motor 110 has been started.

At step 320, the one or more processors preprocess the magnetic field data. In an embodiment, where the sampling rate of the triaxial magnetic field sensor is not constant or where the samples from the first and second axes are taken at different sampling periods, the one or more processors perform interpolation (linear, cubic or spline) to get an approximately equi-spaced and simultaneous magnetic field data of magnetic field strength from the first and second axes. Upon getting the interpolated continuous magnetic field data of the first and second axes, the magnetic field data is de-trended to remove static background magnetic flux and the drift experienced by the magnetic field sensors. De-trending is performed using techniques known in the art.

At step 330, the one or more processors determine the operating slip frequency from the de-trended magnetic field data corresponding to the magnetic field strength in the first and second axes. The de-trended magnetic field data of each axis in the time domain is converted to frequency spectrum in frequency domain using a fast Fourier transform. Then, the one or more processors perform peak detection within a predetermined range in the first frequency spectrum corresponding to the first axis and the second frequency spectrum of the second axis to detect the frequency having the maximum amplitude. Peak detection is performed one or more techniques well known in the art such as least square curve fitting etc. The predetermined range for peak detection is determined as follows Actual Line frequency<=nominal line frequency+ defined running tolerance of the machine  (1)

Operating Slip frequency<=nominal slip*Actual line frequency  (2)

Operating Slip frequency<=nominal slip*(nominal line frequency+defined running tolerance)  (3)

So, according to equation three, the operating slip frequency would lie in between nominal slip*(line frequency+1%) and 0 hertz (at no load situation). The largest peak within the predetermined range is indicative of the value of the operating slip frequency.

At step 340, the one or more processors detect the rotor fault based on the de-trended magnetic field data and the determined operating slip frequency. Subsequent to the detection of the operating slip frequency, the one or more processors calculates the average of the amplitude of the operating slip frequency in the first axis and the amplitude of the operating slip frequency in the second axis.

The calculated average is compared with a predetermined value to detect whether a fault exists in the rotor. In an embodiment, the predetermined value is the product of the cumulative averages of the signals in each axis and a predetermined constant. When the calculated average is less than the predetermined value, the one or more processor determine that the rotor is healthy. This essentially means that imbalance between the magnetic field along the first axis and the magnetic field along the second axis is low. When the calculated average is greater than the predetermined value, the one or more processor determine that the rotor is faulty. This essentially means that imbalance between the magnetic field along the first axis and the magnetic field along the second axis is high. This is further explained in the description of FIG. 4.

At step 350, the one or more processors determine the type of the detected fault and severity of the fault. In an embodiment, where the magnitude of the operating slip frequency in the first axis i.e. axial magnetic field is greater than the magnitude of the operating slip frequency in the second axis i.e. radial magnetic field, a broken rotor bar fault is indicated. In an embodiment, where the magnitude of the operating slip frequency in the first axis i.e. axial magnetic field is less than the magnitude of the operating slip frequency in the second axis i.e. radial magnetic field, a rotor misalignment fault is indicated. The severity of the fault is calculated as the percentage of unbalance between the peak magnitude or amplitude of the operating slip frequency in the radial and axial field.

In an embodiment, the data analysis unit 120 measures magnetic field strength along a third axis and generates a third frequency spectrum from the measured magnetic field strength along the third axis. Then the data analysis unit 120 identifies a peak within the predetermined range in the third frequency spectrum, and determines a frequency corresponding to the identified peak. Finally, the data analysis unit 120 compares the determined frequency against the determined operating slip frequency for detecting fault in a magnetic field sensor from the one or more magnetic field sensors. In case the determined frequency is not substantially similar to the determined operating slip frequency, the data analysis unit 120 transmits a warning to the remote service device 130 to indicate that a magnetic field sensor is faulty or is not calibrated properly.

Figure 4:
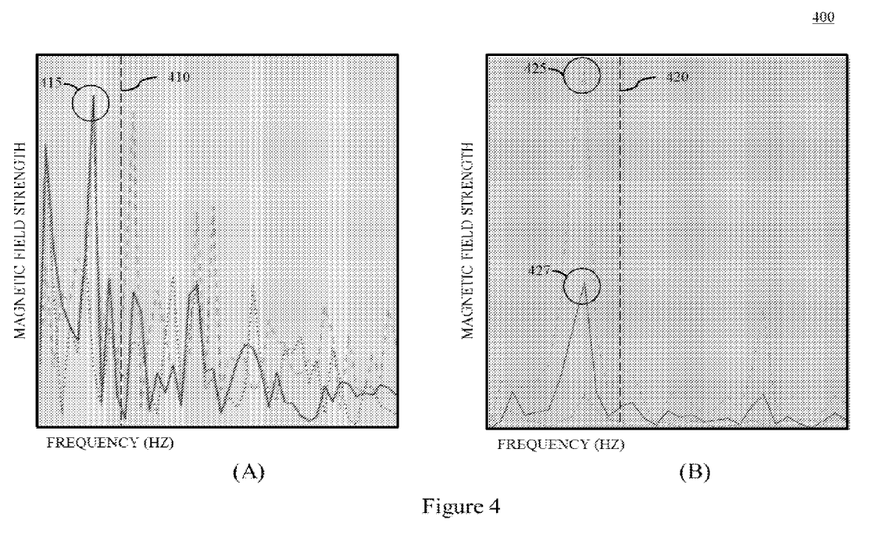
FIGS. 4 illustrates a spectrum of magnetic field in a first axis and second axis of a healthy electric machine and a spectrum of magnetic field in the first axis and second axis of an electric machine with rotor bar fault, in accordance with various embodiments of the present invention.

FIGS. 4 illustrates a spectrum of magnetic field in the first axis (shown with a continuous line) and second axis (shown with a short dashed line) of a healthy electric machine and a spectrum of magnetic field in the first axis and second axis of an electric machine with rotor bar fault, in accordance with various embodiments of the present invention. As explained previously, lines 410 and 420 indicate the upper limit of the predetermined range within which the operating slip frequency lies. The peak indicative of the operating slip frequency within the predetermined range is indicated by circle 415 in the healthy motor, and circle 425 in the second axis and circle 427 in the first axis in a faulty motor. As seen from the FIG. 4(A), when a motor is healthy the amplitude of the operating slip frequency in the first and second axis is relatively close to the floor (i.e. average) of the spectrum. As seen from the FIG. 4(B), when a rotor fault exists, the amplitude of the operating slip frequency in the first and second axis is relatively distant from the floor (i.e. average) of the spectrum.

In another embodiment, the current invention discloses a portable unit, movable with freedom with respect to the motor 110, for example in linear movement, in circular movement, in forward and backward movement, and so on. The portable unit can be any device, such as a mobile phone and other electronics devices; having a processing unit and magnetic field sensor embedded in the potable unit to distinguish healthy machine from the one with broken rotor bar or rotor misalignment, by that no additional hardware except mobile phone is required. When the portable unit moves around the electric machine, the magnetic field sensor integrated therein can measure magnetic field intensity at least one of a plurality point of a path of the portable unit's free movement, and the skilled person should understand that any path consists of a multiple of points linking together. The processing unit can receive at least one corresponding magnetic field intensity signal from the magnetic sensor, compare at least one magnetic field intensity value to at least one corresponding expected value, and determining, based on the comparison, if a fault is present in the electric machine.

Figure 5:
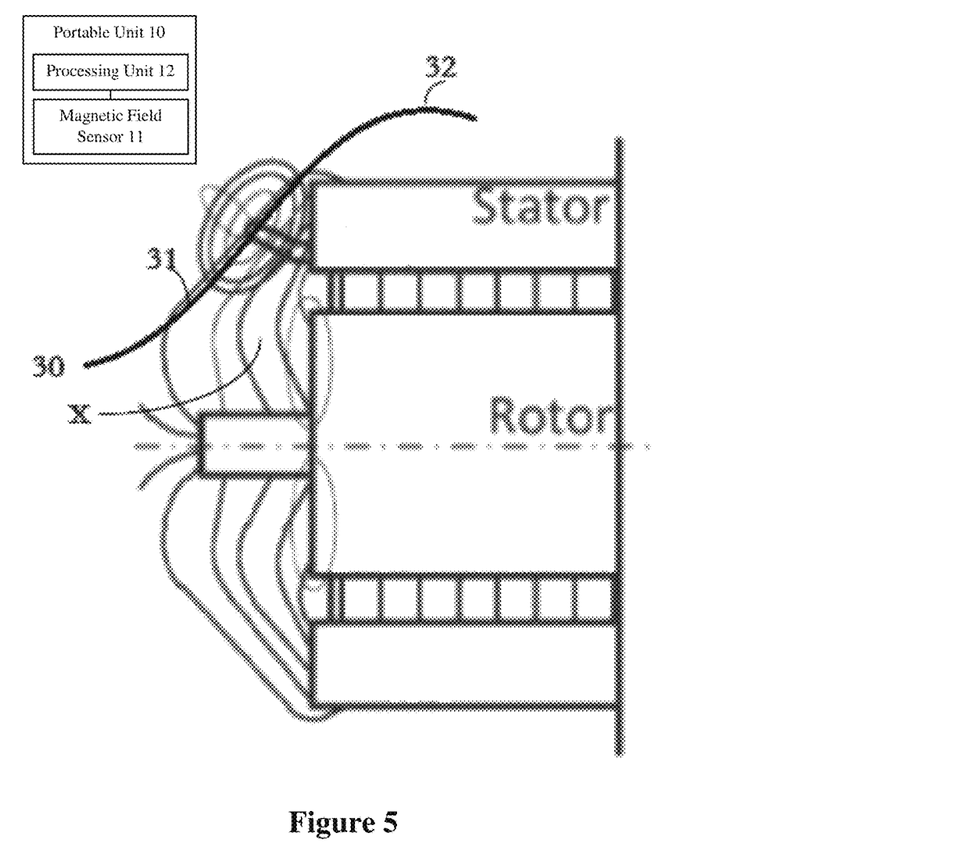
FIG. 5 illustrates a path in which a portable unit moves with respect to the electric machine, in accordance with various embodiments of the present invention.

FIG. 5 illustrates a path in which the portable unit according to an embodiment of present invention moves with respective to the electric machine. As shown in FIG. 5, the path 30 consists of a multiple of points linking together. For example, a first point 31 of the multiple of points of the path is located in the area where an axial magnetic field is present around the electric machine; a second point 32 of the multiple points of the path of is located in area where a radial magnetic field is present around the electric machine. The portable unit 10 can move to the first point 31 or the second point 32 from another point along the path 30, or can move between the first point 31 and the second point 32 along the path 30. The skilled person should understand that the first point 31 and 50 the second point 32 are only for example indicating locations in the areas of an axial magnetic field and a radial magnetic field, and the path 30 is for example of the possible route of the portable unit. The skilled person should understand that there is some area of the electric machine on which it is difficult to install sensors, for example in the space between the end of the rotor and the stator, or where it is difficult to install the magnetic field sensor on the output end of the rotor where the output end of the rotor is mechanically linked to a shaft. It is easier to move the portable unit into such place and measure the rotor magnetic field leakage therein. The magnetic field sensor 11 integrated in the portable unit 10 (illustrated diagrammatically in FIG. 5) can measure the axial magnetic field intensity for axial magnetic field at the first point 31 or measure the radial magnetic field intensity for radial magnetic field at the second point 32. The processing unit 12 integrated in the portable unit 10 can receive the magnetic field intensity signal representing the axial magnetic field leakage at the first point 31 from the magnetic field sensor 11 integrated in the portable unit 10, and/or receive the magnetic field intensity signal representing the radial magnetic field leakage at the first point 32 from the magnetic field sensor 11 integrated in the portable unit 10, and can compare the received magnetic field intensity value to expected value and determine based on the comparison if a fault is present in the electric machine.

In accordance with the current invention, to perform condition monitoring of electric machine, the operator simply has to install the data analysis unit 120 on frame of the motor, akin to the name plate. Besides, it makes the result more accurate by condition monitoring electric machine's magnetic field directly and determining the electric machine's condition accordingly. By measuring magnetic field instead of current or vibration not only whole analysis can be performed just with the condition monitoring system but by measuring magnetic field the root of the problem is measured directly.

This written description uses examples to describe the subject matter herein, including the best mode, and also to enable any person skilled in the art to make and use the subject matter. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

FIG. 5 illustrates a path in which the portable unit according to an embodiment of present invention moves with respective to the electric machine. As shown in FIG. 5, the path 30 consists of a multiple of points linking together. For example, a first point 31 of the multiple of points of the path is located in the area where an axial magnetic field is present around the electric machine; a second point 32 of the multiple points of the path of is located in area where a radial magnetic field is present around the electric machine. The portable unit 10 can move to the first point 31 or the second point 32 from another point along the path 30, or can move between the first point 31 and the second point 32 along the path 30. The skilled person should understand that the first point 31 and 50 the second point 32 are only for example indicating locations in the areas of an axial magnetic field and a radial magnetic field, and the path 30 is for example of the possible route of the portable unit. The skilled person should understand that there is some area of the electric machine on which it is difficult to install sensors, for example in the space between the end of the rotor and the stator, or where it is difficult to install the magnetic field sensor on the output end of the rotor where the output end of the rotor is mechanically linked to a shaft. It is easier to move the portable unit into such place and measure the rotor magnetic field leakage therein. The magnetic field sensor 11 integrated in the portable unit 10 (illustrated diagrammatically in FIG. 5) can measure the axial magnetic field intensity for axial magnetic field at the first point 31 or measure the radial magnetic field intensity for radial magnetic field at the second point 32. The processing unit 12 integrated in the portable unit 10 can receive the magnetic field intensity signal representing the axial magnetic field leakage at the first point 31 from the magnetic field sensor 11 integrated in the portable unit 10, and/or receive the magnetic field intensity signal representing the radial magnetic field leakage at the first point 32 from the magnetic field sensor 11 integrated in the portable unit 10, and can compare the received magnetic field intensity value to expected value and determine based on the comparison if a fault is present in the electric machine.

What is claimed is:

1. A method of detecting a rotor fault in an electric machine using a data analysis unit having one or more magnetic field sensors and one or more processors, the method comprising:

measuring, by the one or more magnetic field sensors of the data analysis unit, magnetic field strength along a first axis, a second axis, and a third axis, wherein the first axis is at a first angle to the axis of the rotor of the electric machine, the second axis is at a second angle to the axis of the rotor of the electric machine, and the third axis is at a third angle to the first axis;

determining, by the one or more processors of the data analysis unit, an operating slip frequency of the electric machine using the measured magnetic field strength along the first axis and the second axis, wherein determining the operating slip frequency comprises (i) generating a first frequency spectrum from the measured magnetic field strength along the first axis and a second frequency spectrum from the measured magnetic field strength along the second axis; (ii) identifying a peak within a predetermined range in at least one of the first frequency spectrum and the second frequency spectrum; and (iii) identifying a frequency corresponding to the identified peak as the operating slip frequency;

determining, by the one or more processors of the data analysis unit, an amplitude of the determined operating slip frequency in the first frequency spectrum and an amplitude of the determined operating slip frequency in the second frequency spectrum;

detecting, by the one or more processors of the data analysis unit, the rotor fault by comparing the amplitude of the determined operating slip frequency in the first frequency spectrum and the amplitude of the determined operating slip frequency in the second frequency spectrum against a predetermined threshold; and detecting, by the one or more processors of the data analysis unit, a magnetic field sensor fault by (i) generating a third frequency spectrum from the measured magnetic field strength along the third axis, (ii) identifying a peak within the predetermined range in the third frequency spectrum, (iii) comparing a frequency corresponding to the identified peak in the third frequency spectrum against the determined operating slip frequency.

2. The method as claimed in claim 1, further comprising:
determining, by the one or more processors of the data analysis unit, a type of the detected rotor fault by comparing the amplitude of the determined operating slip frequency in the first frequency spectrum with the amplitude of the determined operating slip frequency in the second frequency spectrum, and determining, by the one or more processors of the data analysis unit, a severity of the detected rotor fault based on the amplitude of the determined operating slip frequency in the first frequency spectrum and the amplitude of the determined operating slip frequency in the second frequency spectrum.

3. The method as claimed in claim 1, further comprising calculating, by the one or more processors of the data analysis unit, the predetermined range based on a nominal slip frequency associated with the electric machine and a nominal line frequency associated with the electric machine.

4. A system for detecting a rotor fault in an electric machine, the system comprising:
one or more magnetic field sensors for measuring magnetic field strength along a first axis, a second axis, and a third axis, wherein the first axis is substantially parallel to the axis of the rotor of the electric machine, wherein the second axis is at an angle to the first axis, and wherein the third axis is at a third angle to the first axis;

a network interface configured to communicate with a remote service device;

one or more processors configured to (i) generate a first frequency spectrum, a second frequency spectrum, and a third frequency spectrum from the measured magnetic field strength along the first axis, the second axis, and the third axis, respectively; (ii) identify a first peak within a predetermined range in at least one of the first frequency spectrum and the second frequency spectrum; (iii) identify an operating slip frequency corresponding to the identified first peak; (iv) detect the rotor fault based on an amplitude of the determined operating slip frequency in the first frequency spectrum and an amplitude of operating slip frequency in the second frequency spectrum; (v) identify a second peak within the predetermined range in the third frequency spectrum; and (vi) detect a magnetic field sensor fault based on a frequency corresponding to the identified second peak and the determined operating slip frequency; and a memory module operatively coupled to the one or more processors.

5. The system as claimed in claim 4, wherein the system is affixed on a frame of the electric machine close to a drive side bearing of the electric machine.

6. The system as claimed in claim 4, wherein the one or more processors are further configured to determine type and severity of the detected rotor fault based on the amplitude of the determined operating slip frequency in the first frequency spectrum and the amplitude of the determined operating slip frequency in the second frequency spectrum.

* * * * *